（12）United States Patent
Gomez et al.

(10) Patent No.: US 7,589,377 B2
(45) Date of Patent: Sep. 15, 2009

(54) GATE STRUCTURE WITH LOW RESISTANCE FOR HIGH POWER SEMICONDUCTOR DEVICES

(75) Inventors: Mercedes P. Gomez, Temecula, CA (US); Emil M. Hanna, Granada Hills, CA (US); Wen-Ben Luo, Torrance, CA (US); Qingchun Zhang, Cary, NC (US)

(73) Assignee: The Boeing Company, Chicago, IL (US)

( * ) Notice: Subject to any disclaimer, the term of this patent is extended or adjusted under 35 U.S.C. 154(b) by 293 days.

(21) Appl. No.: 11/539,482

(22) Filed: Oct. 6, 2006

(65) Prior Publication Data

US 2008/0085591 A1  Apr. 10, 2008

(51) Int. Cl.
*H01L 21/4763* (2006.01)

(52) U.S. Cl. .................. 257/330; 257/331; 257/333; 257/355; 257/495; 257/497; 257/E21.158; 257/E21.223; 257/E21.429; 257/E21.544; 257/E29.021; 257/E29.118; 257/E29.201; 257/E29.258; 257/E29.264

(58) Field of Classification Search ............... 438/270, 438/282, 289, 300, 586; 257/324–355, 495–497, 257/E21.158, 223, 429, 544, E29.021, 26, 257/118, 201, 258, 264
See application file for complete search history.

(56) References Cited

U.S. PATENT DOCUMENTS

| 4,453,305 | A | * | 6/1984 | Janes et al. | 438/282 |
|---|---|---|---|---|---|
| 4,541,001 | A | * | 9/1985 | Schutten et al. | 257/331 |
| 4,612,465 | A | * | 9/1986 | Schutten et al. | 327/434 |
| 4,713,678 | A | * | 12/1987 | Womack et al. | 257/302 |
| 4,876,215 | A | * | 10/1989 | Hsu | 438/209 |
| 5,233,215 | A | * | 8/1993 | Baliga | 257/490 |
| 6,509,607 | B1 | * | 1/2003 | Jerred | 257/330 |
| 7,323,386 | B2 | * | 1/2008 | Yilmaz | 438/268 |
| 7,381,992 | B2 | * | 6/2008 | Ryu | 257/77 |
| 7,449,354 | B2 | * | 11/2008 | Marchant et al. | 438/39 |
| 7,476,932 | B2 | * | 1/2009 | Zhang et al. | 257/330 |
| 2001/0031551 | A1 | * | 10/2001 | Hshieh et al. | 438/637 |
| 2002/0056884 | A1 | * | 5/2002 | Baliga | 257/492 |
| 2002/0130365 | A1 | * | 9/2002 | Song et al. | 257/355 |
| 2003/0062569 | A1 | * | 4/2003 | Letavic | 257/330 |
| 2004/0021233 | A1 | * | 2/2004 | Kinzer et al. | 257/778 |
| 2006/0014349 | A1 | * | 1/2006 | Williams et al. | 438/270 |
| 2008/0079065 | A1 | * | 4/2008 | Zhang et al. | 257/330 |

* cited by examiner

*Primary Examiner*—Michael S Lebentritt
(74) *Attorney, Agent, or Firm*—Haynes and Boone, LLP

(57) ABSTRACT

In accordance with an embodiment of the present invention, a gate structure for a U-shape Metal-Oxide-Semiconductor (UMOS) device includes a dielectric layer formed into a U-shape having side walls and a floor to form a trench surrounding a dielectric layer interior region, a doped poly-silicon layer deposited adjacent to the dielectric layer within the dielectric layer interior region where the doped poly-silicon layer has side walls and a floor surrounding a doped poly-silicon layer interior region, a first metal layer deposited on the doped poly-silicon layer on a side opposite from the dielectric layer where the first metal layer has side walls and a floor surrounding a first metal layer interior region, and an undoped poly-silicon layer deposited to fill the first metal layer interior region.

18 Claims, 7 Drawing Sheets

GATE STRUCTURE WITH LOW RESISTANCE FOR HIGH POWER SEMICONDUCTOR DEVICES

TECHNICAL FIELD

The present invention relates generally to semiconductor devices, and more particularly to a novel gate structure with low resistance for high power semiconductor devices.

BACKGROUND

In current power device technology, including Junction Field Effect Transistor (JFET), Metal-Oxide-Semiconductor Field Effect Transistor (MOSFET), and trench Insulated Gate Bipolar Transistor (IGBT), the use of highly doped poly silicon as a gate material has the advantage of being compatible to conventional silicon processes, but the resulting gate resistance is undesirable since it typically will affect the high frequency performance of the resulting device. In high speed Integrated Circuits (ICs), the use of metal films as gate materials, including molybdenum (Mo), tungsten (W), and silicides, provide lower resistivity, but the process may not be compatible with certain processes in power devices and on some materials such as silicon-carbide (SiC). One or more embodiments address these and other disadvantages in a cost effective manner.

SUMMARY

One or more embodiments provide a gate structure with a significantly decreased gate resistance which allows device operation speeds to reach into the MHz range, while fabrication of the gate structure is compatible thermal and/or isolation processes. One or more embodiments address problems related to a typically low inversion channel mobility and how the depletion region from gate junction typically increases device resistance. A poly-silicon layer may be grown between an oxide film of a Metal-Oxide-Semiconductor (MOS) gate and a gate metal to reduce or prevent contamination from the gate metal during thermal process at high temperature. The gate metal may be deposited on a doped poly-silicon film and etched or reduced to just below the source mesa top surface.

For some high power semiconductor devices with a U-shape gate, such as U-shape Metal Oxide Semiconductor Field Effect Transistors (UMOSFETs), and Trench Insulated Gate Bipolar Transistors (IGBTs), the UMOS gate corners may be exposed to a high electrical field under the OFF state, which can degrade the device blocking rating significantly and result in a low yield. Even if a junction gate having an opposite polarity to the drift region is introduced to relieve the field stress, a narrow gap between the junction and the adjacent layer may cause the depletion layer to pinch off and reduce a forward current. Moreover, the introduction of a gate junction can cause depletion pinching off between the gate junction and base junction in the MOS channel, if the spacing is not adequate. For high power devices, the drift region is normally lightly doped, thus the spacing between the junction and channel must be carefully determined, creating significant difficulties during fabrication, and specifically in an etching process for a deep mesa. This problem may be compounded when using Silicon Carbide (SiC) or other hard semiconductor materials. Moreover, the carrier mobility in the MOS inversion layer is normally lower than that in an accumulation layer, for example in SiC, and that may be even worse for a traditional UMOS structure. In this case, the MOS threshold voltage may be extremely high and form a strong conducting inversion layer.

Gate structures and methods for using are disclosed herein to provide a cost effective and efficient U-shape Metal-Oxide-Semiconductor (UMOS) gate structure and a Junction Field Effect Transistor (JFET) device that may be used in high power MOS-based devices for a multitude of commercial and military applications. In accordance with an embodiment of the present invention, a gate structure for a U-shape Metal-Oxide-Semiconductor (UMOS) device includes a dielectric layer formed into a U-shape having side walls and a floor to form a trench surrounding a dielectric layer interior region, a doped poly-silicon layer deposited adjacent to the dielectric layer within the dielectric layer interior region where the doped poly-silicon layer has side walls and a floor surrounding a doped poly-silicon layer interior region, a first metal layer deposited on the doped poly-silicon layer on a side opposite from the dielectric layer where the first metal layer has side walls and a floor surrounding a first metal layer interior region, and an undoped poly-silicon layer deposited to fill the first metal layer interior region.

According to another embodiment, a method using a UMOS transistor, where the UMOS transistor includes a dielectric layer formed into a U-shape having side walls and a floor to form a trench surrounding a dielectric layer interior region, a doped poly-silicon layer deposited adjacent to the dielectric layer within the dielectric layer interior region where the doped poly-silicon layer has side walls and a floor surrounding a doped poly-silicon layer interior region and where the doped poly-silicon layer is composed of a positively doped semiconductor material selected from the group consisting of silicon (Si) and silicon carbide (SiC), a first metal layer deposited on the doped poly-silicon layer on a side opposite from the dielectric layer where the first metal layer has side walls and a floor surrounding a first metal layer interior region and where the side walls of the first metal layer are etched below the side walls of the dielectric layer and further where the first metal layer is electrically connected to a gate terminal and where the side walls of the first metal layer are etched below the side walls of the dielectric layer a distance of between about 0.5 microns to about 2.0 microns, an undoped poly-silicon layer deposited to fill the metal layer interior region where the undoped poly-silicon layer is composed of a semiconductor material selected from the group consisting of silicon (Si) and silicon carbide (SiC), a P+ Junction gate adjacent to a floor portion of the dielectric layer, a drift region surrounding the dielectric layer and the P+ Junction gate, a drain terminal adjacent to the drift region on a side opposite the P+ Junction gate, a source terminal adjacent to the dielectric layer on a side facing the dielectric layer interior region, and the method of using the UMOS transistor includes the operation of applying a controlling voltage to the gate terminal where the controlling voltage applied to the gate terminal is effective in controlling the flow of electrical current between the source terminal and the drain terminal.

According to another embodiment, a gate structure for a Junction Field Effect Transistor (JFET) device includes a dielectric layer having two disjoint sidewall regions deposited on side walls of a trench having side walls and a floor where each disjoint side wall region has a first side facing into a trench interior region and a second side facing away from the trench interior region, a metal layer formed into a U-shape deposited on the dielectric layer first sides and the floor of the of the trench surrounding a metal layer interior region, an undoped poly-silicon layer deposited to fill the metal layer interior region and the undoped poly-silicon layer is composed of a semiconductor material selected from the group consisting of silicon (Si) and silicon carbide (SiC).

According to yet another embodiment, a method of using a junction field effect transistor (JFET) transistor, where the JFET transistor includes a dielectric layer deposited on side walls of a trench having side walls and a floor where each side wall having a first side facing into a trench interior region and a second side facing away from the trench interior region, a metal layer formed into a U-shape deposited on the dielectric layer first sides and the floor of the of the trench surrounding a metal layer interior region where an end portion of the side walls of the metal layer is disposed below the side walls of the dielectric layer disjoint sidewall regions a distance of between about 0.5 microns to about 2.0 microns, an undoped poly-silicon layer deposited to fill the metal layer interior region where the undoped poly-silicon layer being composed of a semiconductor material selected from the group consisting of silicon (Si) and silicon carbide (SiC), a P+ Junction gate adjacent to a floor portion of the metal layer, a drift region surrounding the dielectric layer second sides and the P+ Junction gate where the drift region being composed of a semiconductor material selected from the group consisting of silicon (Si) and silicon carbide (SiC), a drain terminal adjacent to the drift region on a side opposite the P+ Junction gate, a source terminal adjacent to the drift region on a side facing the metal layer interior region, and where the method of using the JFET transistor includes the operation of applying a controlling voltage to the gate terminal where the controlling voltage applied to the gate terminal is effective in controlling the flow of electrical current between the source terminal and the drain terminal.

The scope of the present invention is defined by the claims, which are incorporated into this section by reference. A more complete understanding of embodiments of the present invention will be afforded to those skilled in the art, as well as a realization of additional advantages thereof, by a consideration of the following detailed description. Reference will be made to the appended sheets of drawings that will first be described briefly.

BRIEF DESCRIPTION OF THE FIGURES

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
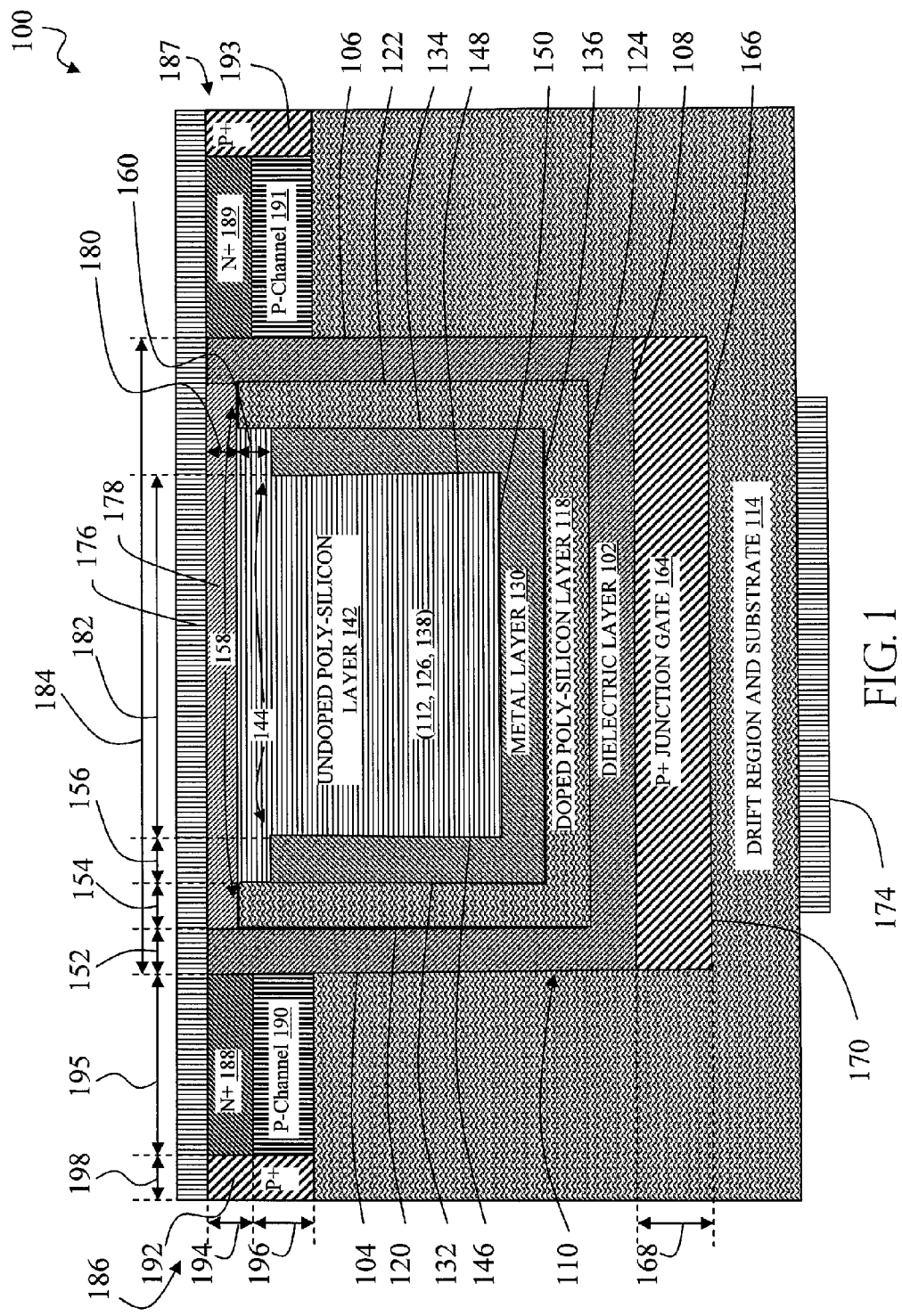
FIG. 1 shows a side view of an exemplary gate structure for a U-shape Metal-Oxide-Semiconductor (UMOS) device, in accordance with an embodiment of the present invention.

FIG. 1 shows a side view of an exemplary gate structure 100 for a U-shape Metal-Oxide-Semiconductor (UMOS) device, in accordance with an embodiment of the present invention. The gate structure 100 may include a dielectric layer 102 formed into a U-shape having side walls (104, 106) and a floor 108 surrounding a dielectric layer interior region 112 where the trench 110 is formed in a semiconductor drift region 114. The drift region 114 may be constructed from silicon (Si) or silicon-carbide (SiC) and may also provide physical support for the novel gate structure 100 as a substrate. Other substrate structures may be used and attached below the drift region 114.

Gate structure 100 may also include a doped poly-silicon layer 118 deposited adjacent to the dielectric layer 102 within the dielectric layer interior region 112. The doped poly-silicon layer 118 may be formed into a U-shape and have side walls (120, 122) and a floor 124 surrounding a doped poly-silicon layer interior region 126. A first metal layer 130 may be deposited on the doped poly-silicon layer 118 on a side opposite from the dielectric layer 102 and adjacent to floor 108 and formed into a U-shape. The first metal layer 130 may have side walls (132, 134) and a floor 136 surrounding a first metal layer interior region 138.

The dielectric layer interior region 112, the doped poly-silicon layer interior region 126, and the first metal layer interior region 138 all describe an interior portion of the trench 110, where the first metal layer interior region 138 is wholly included within the doped poly-silicon layer interior region 126, and the doped poly-silicon layer interior region 126 is wholly included within the dielectric layer interior region 112. The gate structure 100 may also include an undoped poly-silicon layer 142 deposited to fill the first metal layer interior region 138 at least to a top portion 144 of the U-shape doped poly-silicon layer side walls (120, 122). The undoped poly-silicon layer 142 may have side walls (146, 148) in contact with interior facing surfaces of the first metal layer 130 side walls (132, 134), and a floor 150 in contact with an interior facing surface of first metal layer 130 floor 136.

In this disclosure, spatial relation terms such as up, down, bottom, top, side, left, right, above, below, and other terms may be used to describe the locations of various elements. These terms are relative and may be changed based on the location of an element in various drawings, and/or the location of an element in a particular physical embodiment of the invention. For example, an element identified as being above another element may in fact be subsequently identified as below that same element when the device or an illustration of the embodiment is turned upside down. Further, various elements may be described as being on another element, where there may be an intervening layer or element in between. Some drawing features may be exaggerated for clarity.

Figure 2:
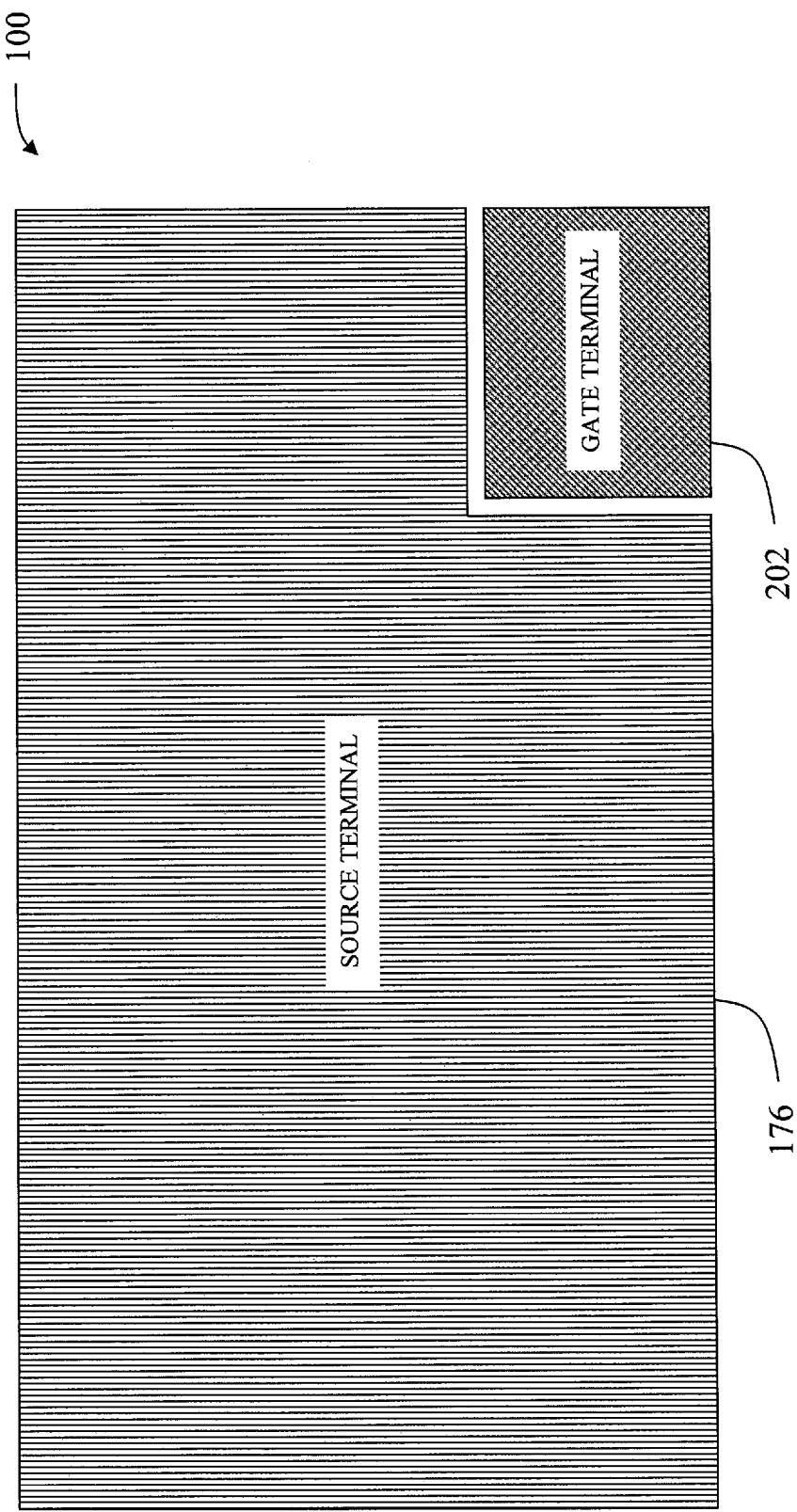
FIG. 2 shows a top view of the gate structure of FIG. 1.

The dielectric layer 102 may be composed of a dielectric material including silicon-dioxide ($SiO_2$) or silicon-nitride ($Si_3N_4$). The dielectric layer 102 may have a thickness 152 of between about 0.4 microns to about 0.8 microns. The doped poly-silicon layer 118 may include a positively doped semiconductor material, silicon (Si) or silicon carbide (SiC), where the doped poly silicon layer 118 has a doping concentration of between about $5 \times 10^{18}$ cm$^{-3}$ to about $5 \times 10^{20}$ cm$^{-3}$. The doped poly silicon layer 118 may have a thickness 154 of between about 2.0 microns to about 4.0 microns. The first metal layer 130 may include molybdenum (Mo) that has a thickness 156 of between about 0.3 microns to about 0.6 microns and having a resistance of about $5 \times 10^{-6}$ ohm/square. FIG. 2 shows a top view of the gate structure 100 of FIG. 1. In reference to both FIG. 1 and FIG. 2, the first metal layer 130 may comprise gate metal that is electrically connected to a gate terminal 202 for the gate structure 100.

Returning to FIG. 1, the end portions 144 of the side walls of the first metal layer 130 may be located below (etched below) the tops 158 of the side walls (120, 122) of the dielectric layer 118 at a distance 160 of between about 0.5 microns to about 2.0 microns. The gate structure 100 may also include a P+ Junction gate 164 that has a first surface adjacent to the floor portion 108 of the dielectric layer 102 and a second surface 166 opposite to the first surface that is adjacent to the drift region 114. The P+junction gate 164 may be composed of a P-type doped semiconductor material such as silicon (Si) or silicon carbide (SiC). The P+junction gate 164 may have a doping concentration of between about $1 \times 10^{18}$ cm$^{-3}$ and $5 \times 10^{18}$ cm$^{-3}$, and may be blanket doped or locally doped. The P+junction gate may have a thickness 168 from about 0.2 microns to about 0.5 microns so that a P+junction gate 164 second surface 166 may be adjacent to a floor region 170 of the trench 110 in drift region 114. In this manner, the drift region 114 may surround the dielectric layer 102 and the P+junction gate 164.

A drain terminal 174 for the gate structure 100 may be adjacent to the drift region 114 on a side opposite the P+junction gate 164 where the drain terminal 174 may comprise a second metal layer including aluminum (Al) or nickel (Ni). A source terminal 176 for the gate structure 100 may be located adjacent to the dielectric layer 102 on a side facing the dielectric layer interior region 112. The source terminal 176 may comprise a third metal layer including aluminum (Al) or nickel (Ni). A cap layer 178 may be located between the source terminal 176 and the undoped poly-silicon layer 142 where the cap layer includes silicon dioxide (SiO2) or undoped poly-silicon. The cap layer 178 has a thickness 180 of between about 0.5 microns to about 2.0 microns. The undoped poly-silicon layer 142 has an interior width 182 of between about 1.0 microns to about 3.0 microns, while the dielectric layer has an exterior width 184 of between about 1.0 microns to about 4.0 microns.

The gate structure 100 may also include a first conduction channel 186 and a symmetrically oriented second conduction channel 187. The first conduction channel 186 may be located adjacent to a top portion of the dielectric layer 102 exterior surface and between the source terminal 176 and the drift region 114 and may include a first N+ doped region 188, a first P-channel region 190, and a first P+ doped region 192. Similarly, the second conduction channel 187 may be located adjacent to a top portion of the dielectric layer 102 exterior surface and between the source terminal 176 and the drift region 114 at a location opposite from the first conduction channel across a middle portion of the trench 110 and may include a symmetrically located second N+ doped region 189, a second P-channel region 191, and a first P+ doped region 193. These structures are essentially symmetric across the middle portion of the trench 110.

The first 188 and second 189 N+ doped regions may be substantially rectangular in shape and may have a first surface oriented toward a top portion of FIG. 1, a second surface oriented toward a bottom portion of FIG. 1, a first end oriented away from the center portion of trench 110, and a second end oriented toward the center portion of trench 110. The first 188 and second 189 N+ doped regions may have a thickness 194 of between about 0.2 microns to about 2.0 microns and a width 195 of between about 0.5 microns to about 2.0 microns. Similarly, first 190 and second 191 P-Channel regions may be substantially rectangular in shape and have a first surface oriented toward a top portion of FIG. 1, a second surface oriented toward a bottom portion of FIG. 1, a first end oriented away from the center portion of trench 110, and a second end oriented toward the center portion of trench 110. The first 190 and second 191 P-Channel regions may have a thickness 196 of between about 0.2 microns to about 2.0 microns and a width 191 of between about 0.5 microns to about 2.0 microns. In this manner, the first N+ doped region 188 first surface may be adjacent to the source terminal 176, and the first N+ doped region 188 second end may be adjacent to the dielectric layer 102 where the dielectric layer 102 meets the source terminal 176. Further, the first N+ doped region 188 second surface may be adjacent to the first P-channel 190 first surface, and the first P-channel 190 second surface may be adjacent to the drift region 114, while the first P-channel 190 second end may be adjacent to the dielectric layer 102. Similarly, the second N+ doped region 189 and the second P-Channel region 191 may be symmetrically oriented in the second conduction channel 187. The N+ doped regions (188, 189) may be located on top of the P-Channel regions (190, 191), as shown in FIG. 1.

The first 192 and second 193 P+ doped regions may have a substantially rectangular shape including a first surface oriented toward a top portion of FIG. 1, a second surface oriented toward a bottom portion of FIG. 1, a first end oriented away from the center portion of trench 110, and a second end oriented toward the center portion of trench 110. The first 192 and second 193 P+ doped regions may have a thickness 196 of between about 0.7 microns to about 4.0 microns and a width 195 of between about 0.2 microns to about 2.0 microns. The first P+ doped region 192 first surface may be adjacent to the source terminal 176, the N+ doped region 188 first end, and the P-channel 190 first end, while the P+ doped region 192 second surface may be adjacent to the drift region 114. The second P+ doped region 193 may be symmetrically located in the second conduction channel 187. The exemplary gate structure 100 provides a high power metal oxide semiconductor devices having a U-shape trench (UMOS) where the gate corners are not exposed to a high electric field during the off state, a device blocking rating that does not degrade significantly, and which has a higher manufacturing yield than traditional devices.

Figure 3:
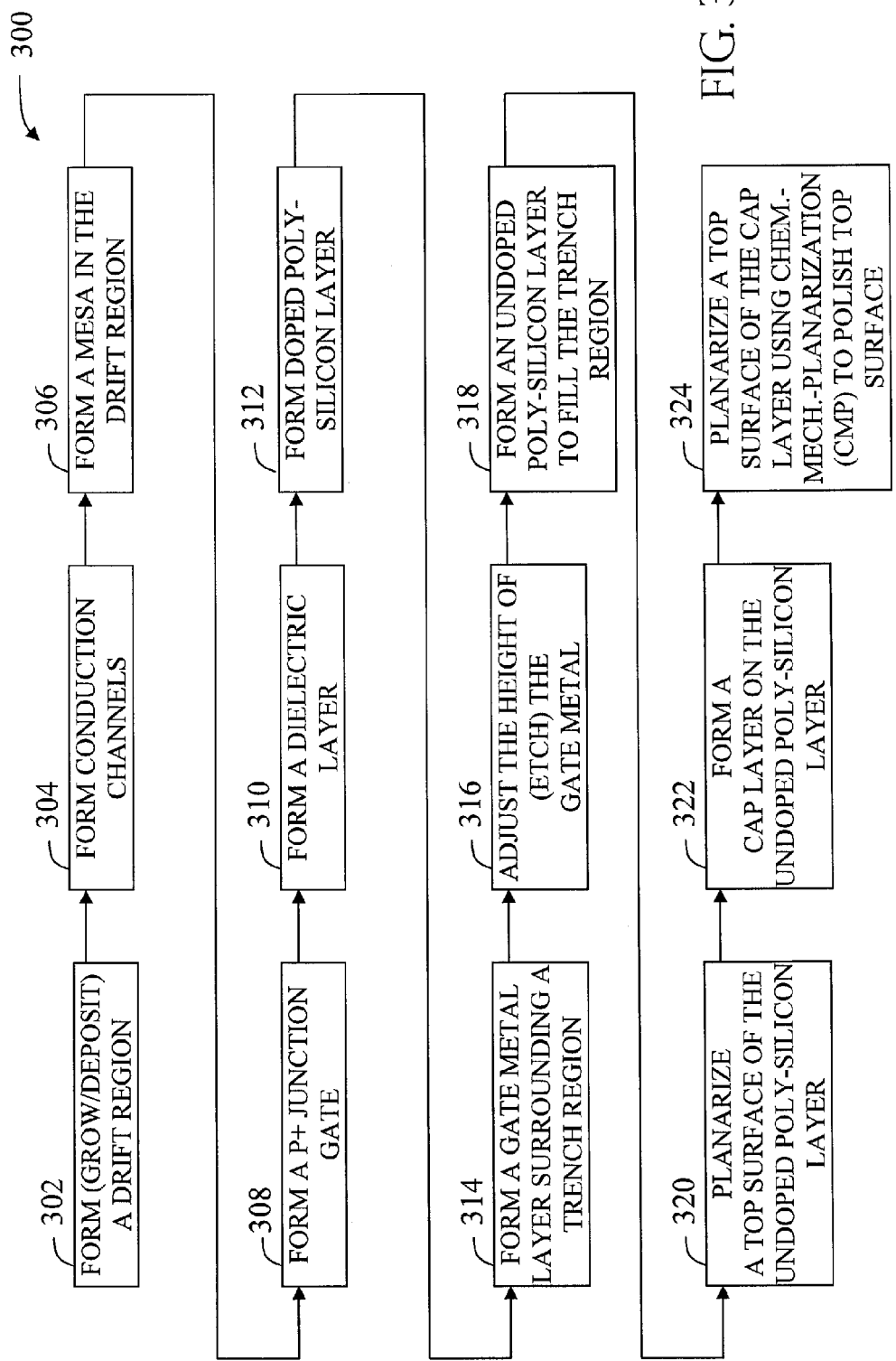
FIG. 3 shows an exemplary fabrication flow 300 of the gate structure of FIG. 1, in accordance with an embodiment of the present invention.

In reference to FIG. 3, a fabrication flow 300 is shown for fabrication of the gate structure 100, in accordance with an embodiment of the present invention. In reference to FIGS. 1-3, flow 300 may include one or more of the following operations, and may begin with forming (e.g. growing or depositing) a drift region 114 in operation 302. Once the drift region 114 is formed, flow 300 may continue with forming the conduction channels (186, 187) in operation 304. Once the conduction channels are formed, flow 300 may continue with forming a mesa, or planar surface, in the drift region comprising the outside of the U-shape structure of the trench 110 in operation 306. Some methods, including the depositing, growing, implanting, activation, or forming of a particular layer may be known within the field of Very Large Scale Integrated (VLSI) fabrication techniques. However, the disclosed gate structure 100, the particular method of making, and the use of disclosed materials in the structure 100 is considered novel. Once the mesa is formed in operation 306, a P+ Junction gate 164 may be formed in a lower portion of the trench 110 on the lower surface or floor of the mesa in operation 308, where operation 308 may include both implantation and activation of the P+ Junction gate 164.

Once the P+ Junction gate 164 is formed, flow 300 may continue with forming a dielectric layer 102 on the walls of the drift region 114 and on a top surface of the P+ Junction gate 164, where the dielectric layer 102 is formed into a U-shape having side walls (104, 106) and a floor 108 surrounding a dielectric layer interior region 112, in operation 310. Flow 300 may continue with forming a doped poly-silicon layer 118 on the walls and floor of the newly formed dielectric layer 102 in operation 312, where the doped poly-silicon layer 118 may be formed into a U-shape and may have side walls (120, 122) and a floor 124 surrounding a doped poly-silicon layer interior region 126. The end portions 158 of the doped poly-silicon layer 118 are formed lower than the end portions of the dielectric layer by a distance 180. Flow 300 may continue with forming a gate metal layer 130 on the walls and floor of the doped poly-silicon layer 118 in operation 314, where the first metal layer 130 may be formed into a U-shape trench interior region and may have side walls (132, 134) and a floor 136 surrounding a first metal layer interior region 138. Flow 300 may continue with adjusting the height of (e.g. etching back) the height of the gate metal layer 130 in operation 316. In this manner, the end portions 144 of the first metal layer 130 are formed lower than the end portions of the doped poly-silicon layer by a distance 160. Any acceptable fabrication method may be used to yield the end portions (158, 144) at their lower position, as described.

Flow 300 may continue with forming an undoped poly-silicon layer 142 that fills the first metal layer interior region 138 and includes the portion above the end portions 144 in operation 318. Once the undoped poly-silicon layer 142 is formed in the gate metal layer 130 interior region 138, flow 300 may continue with planarizing a top surface of the undoped poly-silicon layer 142 in operation 320 to provide a smooth and uniform top surface on the undoped poly-silicon layer 142. Flow 300 may continue with forming a cap layer 178 on top of the polished undoped poly-silicon layer 142 in operation 322, and then planarizing the a top surface of the cap layer 178 using a chemical-mechanical-planarization (CMP) technique to polish the top surface of the cap layer 178 in operation 324. In this manner, the top surface of the cap layer 178 is prepared to receive the source metal layer 176, which provides a more uniform source metal layer. Surface planarization may facilitate the formation of more robust metal connections and eliminate possible field crowding.

Figure 4:
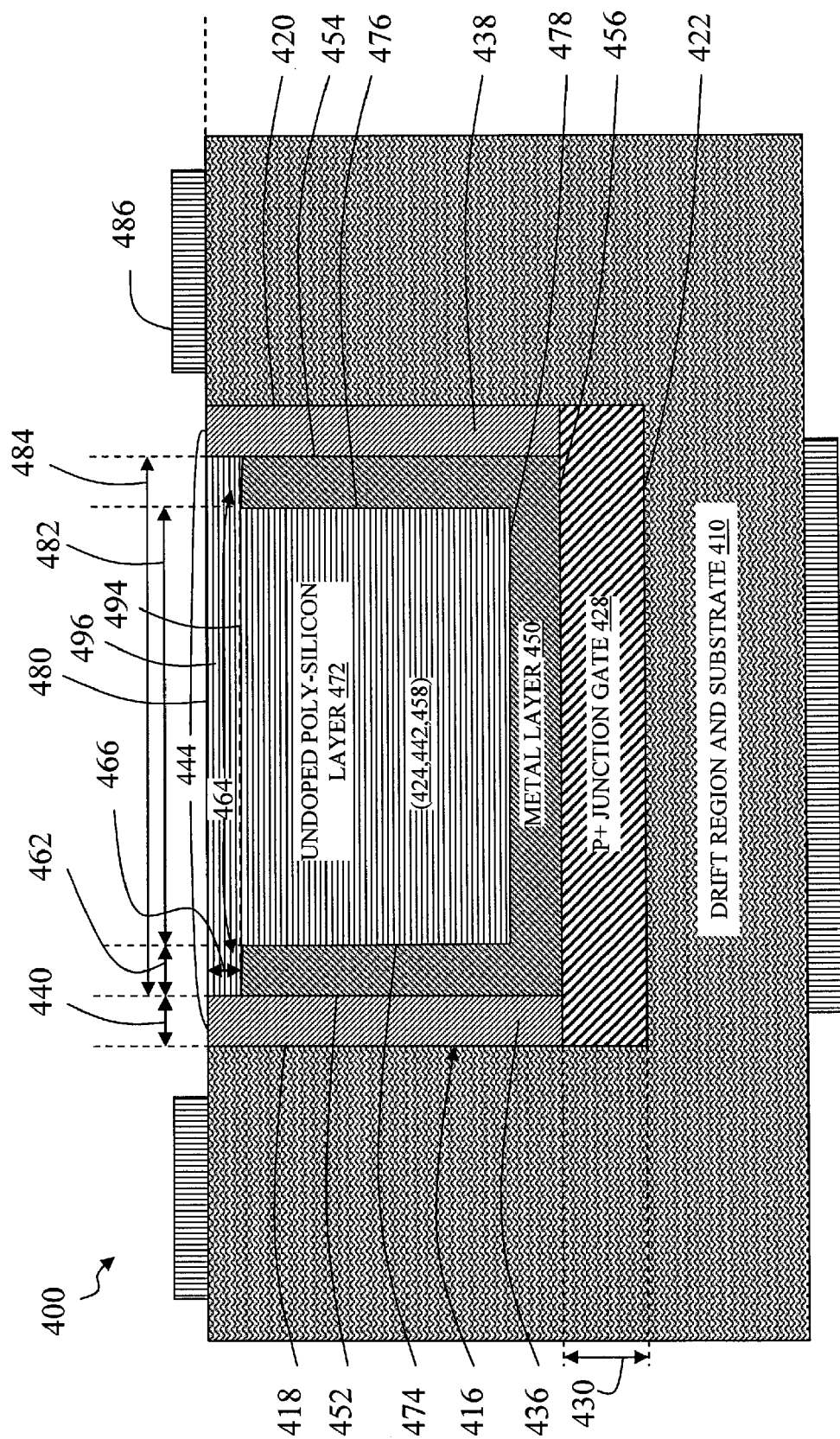
FIG. 4 shows a side view of an exemplary gate structure for a Junction Field Effect Transistor (JFET) device, according to an embodiment of the present invention.

FIG. 4 shows a side view of an exemplary gate structure 400 for a Junction Field Effect Transistor (JFET) device, according to an embodiment of the present invention. The gate structure 400 may include a semiconductor drift region 410 constructed from silicon (Si) or silicon-carbide (SiC) and may also provide physical support for the novel gate structure 400 as a substrate. A mesa or trench 416 is formed in the drift region 410 having side walls (418, 420) and a trench floor 422 surrounding a trench interior region 424. A P+ Junction gate 428 may be deposited on the floor 422 of the drift region 410, where the P+ Junction gate 428 has a height 430 of between about 0.2 microns to about 0.5 microns. The P+junction gate 428 may be blanket doped or locally doped. The P+junction gate 428 may be considered to be a local junction gate and can further decrease the structure 400 forward resistance by reducing JFET effects from the junction gate.

A first dielectric layer 436 and a second dielectric layer 438 are formed on the remaining portions of the walls (418, 420) not covered by the P+ Junction gate 428. In this manner, a dielectric layer 444 has two disjoint sidewall regions (436, 438) deposited on side walls of a trench having side walls and a floor. The dielectric layers (436, 438) may be composed of a dielectric material including silicon-dioxide (SiO2) or silicon-nitride (Si3N4). The dielectric layers (436, 438) may have a thickness 440 of between about 0.4 microns to about 0.8 microns. In this manner, the portion of the walls (412, 414) not covered by the P+ Junction gate 428 and a top surface of the P+ Junction gate 428 surround a dielectric layer interior region 442. Each disjoint side wall region (436, 438) has a first side facing into the dielectric layer interior region 442 and a second side facing away from the dielectric layer interior region 442. The a drift region 410 may surround both the dielectric layer 444 second sides and the P+ Junction gate 428, where the drift region 410 may be composed of a semiconductor material selected from the group consisting of silicon (Si) and silicon carbide (siC).

A metal layer 450 may be deposited on the dielectric side walls (436, 438) and the top surface of the P+ Junction gate 428 formed into a U-shape, where the metal layer 130 may have side walls (452, 454) and a floor 456 surrounding a metal layer interior region 458. The metal layer 450 may include molybdenum that has a thickness 462 of between about 0.3 microns to about 0.6 microns, where the end portions of the side walls of the metal layer 450 may be located below (etched below) the tops 464 of the side walls (452, 454) of the dielectric layers (436, 438) at a distance 466 of between about 0.5 microns to about 2.0 microns. The trench interior region 424, the dielectric layer interior region 442, and the metal layer interior region 458 all describe an interior portion of the trench 416, where the dielectric layer interior region 442 is wholly included within the trench interior region 424, and the metal layer interior region 458 is wholly included within the dielectric layer interior region 442. An alternative gate structure may include disjoint, doped poly-silicon layers between the disjoint sidewall regions (436, 438) and the dielectric layers (452, 454) and the gate metal layer 450.

The gate structure 100 may include an undoped poly-silicon layer 472 deposited to fill the metal layer interior region 458 at least to a top portion 464 of the metal layer 450 side walls (452, 454). The undoped poly-silicon layer 472 may include undoped silicon (Si) or undoped silicon-carbide (SiC) and may have side walls (474, 476) in contact with the metal layer 450 side walls (452, 454) and a floor 478 in contact with the metal layer floor 456. The undoped poly-silicon layer 472 may be formed in two portions, a first portion deposited to fill the metal layer interior region 458 up to a top end of the metal layer 450 and forming an intermediate top surface 494 of the undoped poly-silicon layer 472, and a second portion deposited upon the upon the intermediate top surface 494 to form a cap layer 496 filling up to the top surface of the drift region 410 and the top end of the dielectric layer 444. The cap layer 496 may be constructed from undoped poly-silicon or may be a dielectric layer. A top surface 480 of the undoped poly-silicon layer 472 may be planarized to provide a smooth surface. The undoped poly-silicon layer 472 has an interior width 482 of between about 2.0 microns to about 5.0 microns, while the dielectric layer has an exterior width 484 of between about 1.0 microns to about 4.0 microns.

Figure 5:
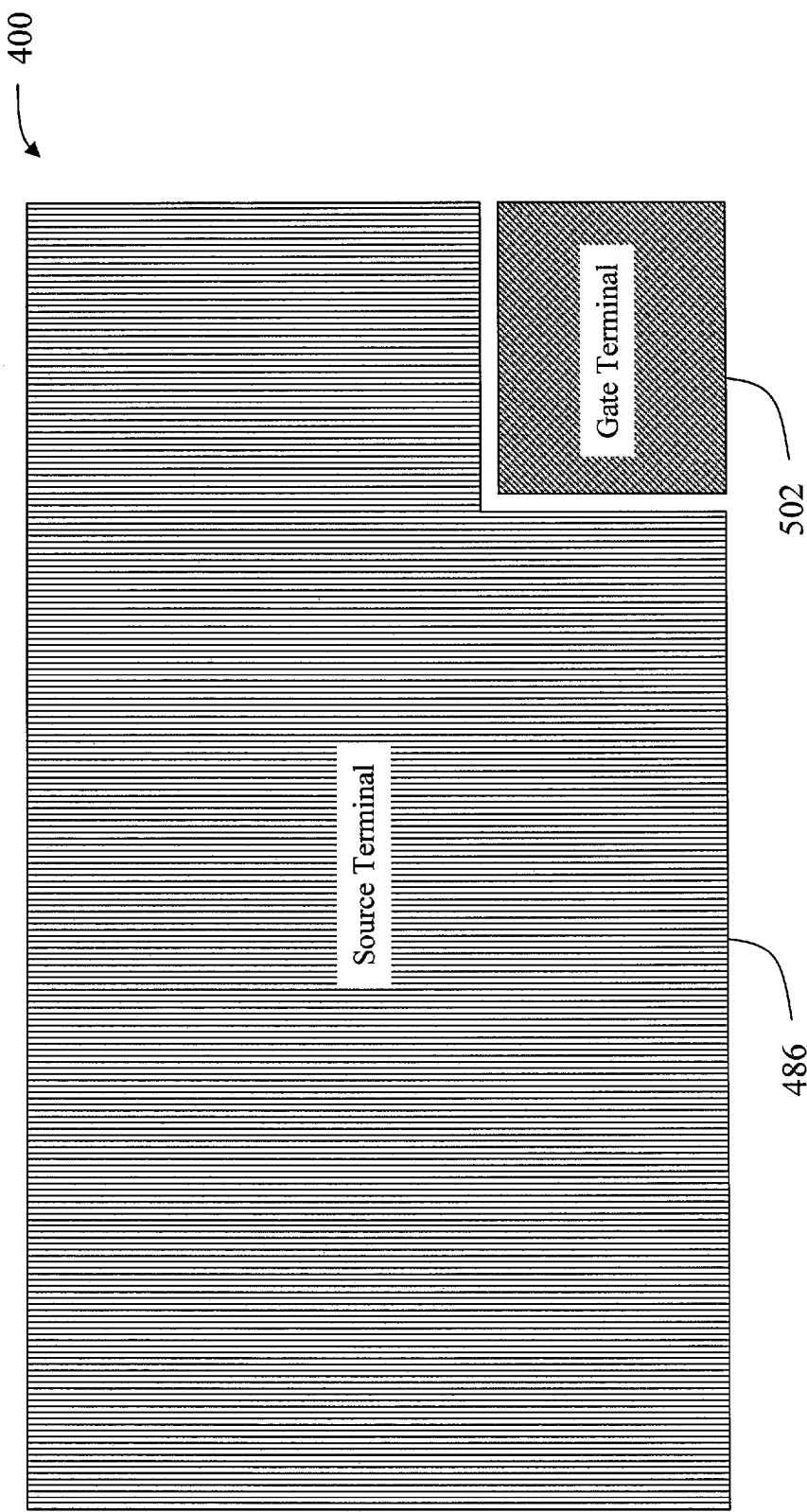
FIG. 5 shows a top plan view of the gate structure of FIG. 4.

A source terminal 486 for the gate structure 400 may be located adjacent to a top surface of the drift region 410 on a side facing the metal layer 450 interior region 458 and surrounding the trench 416, while a drain terminal 490 for the gate structure 400 may be located on a bottom surface of the drift region 410, as shown in FIG. 4. The source terminal 486 and the drain terminal 490 may be composed of metal including aluminum (Al) or nickel (Ni). FIG. 5 shows a top view of the gate structure 400 of FIG. 4, including a gate terminal 502 that may be electrically connected to the gate metal 450 and the source terminal 486.

The dielectric layer 444 may be composed of a dielectric material selected including silicon-dioxide (SiO2) or silicon-nitride (Si3N4), where the dielectric layer has a thickness of between about 0.4 microns to about 0.8 microns. The metal layer 450 may include molybdenum that has a thickness of between about 0.3 microns to about 0.6 microns, where the metal layer may comprise a gate terminal for the gate structure 400. The end portions 464 of the side walls (452, 454) of the metal layer 450 are located (etched) below the side walls of the dielectric layer 444 disjoint sidewall regions (418, 420) a distance 466 of between about 0.2 microns to about 2.0 microns.

Figure 6:
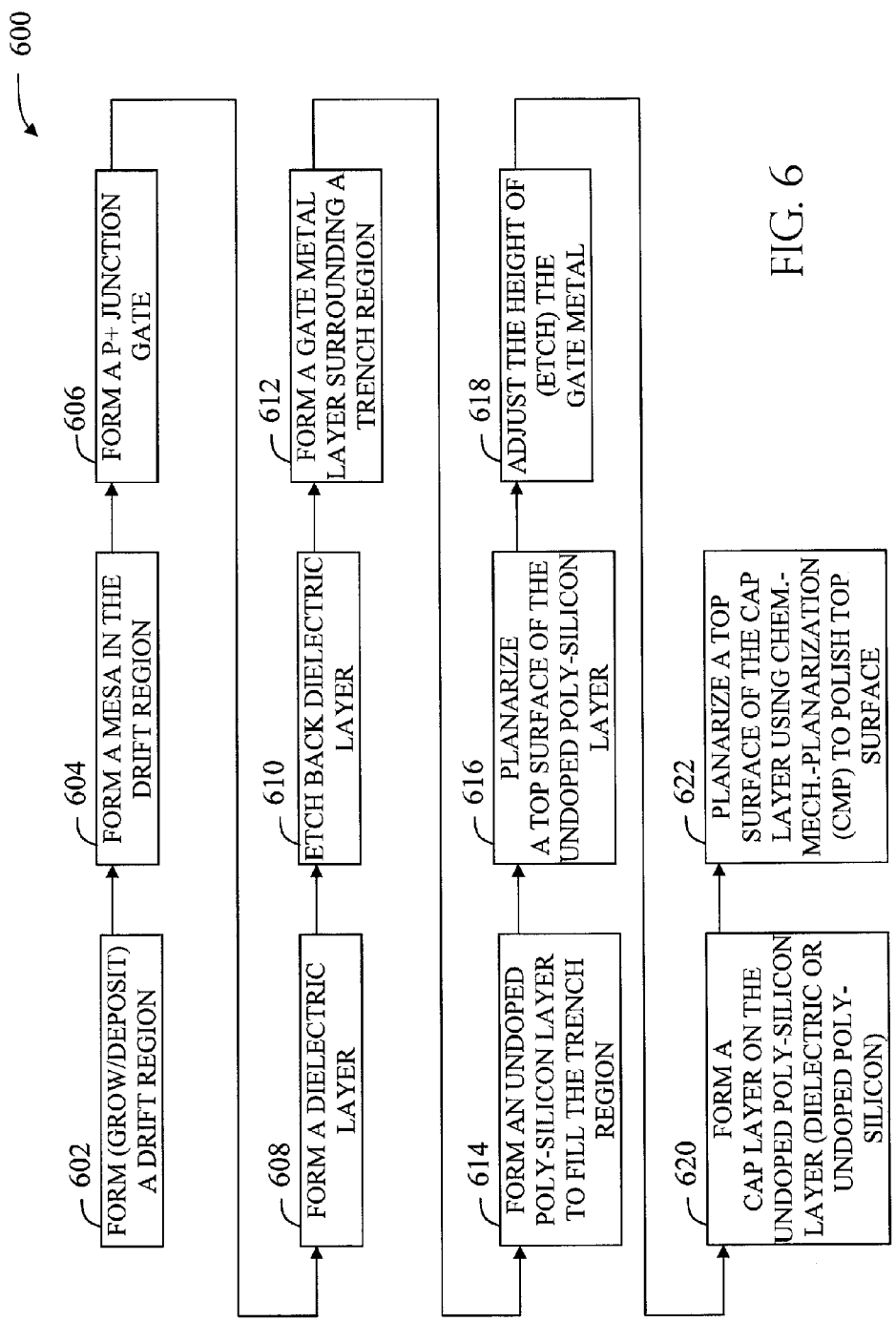
FIG. 6 shows an exemplary fabrication flow 600 of the gate structure of FIG. 4, in accordance with an embodiment of the present invention.

FIG. 6 shows an exemplary fabrication flow 600 of the gate structure 400 of FIG. 4, in accordance with an embodiment of the present invention. In reference to FIGS. 4-6, flow 600 may include one or more of the following operations, and may begin with forming (e.g. growing or depositing) a drift region 410 in operation 602. Once the drift region 114 is formed, flow 300 may continue with forming a mesa, or planar surface, in the drift region comprising the outside of the U-shape structure of the trench 416 in operation 604. Some methods, including the depositing, growing, implanting, activation, or forming of a particular layer may be known within the field of Very Large Scale Integrated (VLSI) fabrication techniques. However, the disclosed gate structure 400, the particular method of making, and the use of disclosed materials in the structure 400 is considered novel. Once the mesa is formed in operation 604, flow 600 may continue with forming a P+ Junction gate 428 in a lower portion of the trench 416 on the lower surface or floor 422 of the mesa in operation 606, where operation 606 may include both implantation and activation of the P+ Junction gate 428.

Once the P+ Junction gate 428 is formed, flow 600 may continue with forming a dielectric layer 444 on the walls of the drift region 410 and on a portion of the top surface of the P+ Junction gate 428, where the dielectric layer 444 is formed into a two disjoint side walls (436, 438), in operation 608. Flow 600 may continue with adjusting the height of (e.g. etching back) the top portion of the dielectric layer 444 in operation 610. In this manner, the end portions 464 of the gate metal layer 450 are formed lower than the end portions of the dielectric layer 444 by a distance 466. Any acceptable fabrication method may be used to yield the end portions of the dielectric layer disjoint regions (436, 438) at their lower position, as described. Flow 600 may then continue with forming a gate metal layer 450 on the dielectric layer 444 walls (436, 438) and a remaining portion of the top surface of the P+ Junction gate 428 not covered by the dielectric layer 444 in operation 612, where the gate metal layer 450 may be formed into a U-shape and may have side walls (452, 454) and a floor 456 surrounding a gate metal layer interior region 458.

Flow 600 may continue with forming an undoped poly-silicon layer 472 that fills the gate metal layer interior region 458 and that does not include the portion of the metal layer interior region 458 above the end portions 464 in operation 614. Once the undoped poly-silicon layer 472 is formed in the gate metal layer 450 interior region 458, flow 600 may continue with planarizing a top surface of the undoped poly-silicon layer 472 in operation 616 to provide a smooth and uniform intermediate top surface on the undoped poly-silicon layer 472. Flow 600 may continue with adjusting the height of (e.g. etching back) the height of the gate metal 450 in operation 618. Flow 600 may continue with forming a cap layer 496 on top of the polished undoped poly-silicon layer 472 in operation 620, and then planarizing the a top surface of the cap layer 496 using a chemical-mechanical-planarization (CMP) technique to polish the top surface of the cap layer 496 in operation 622.

Figure 7:
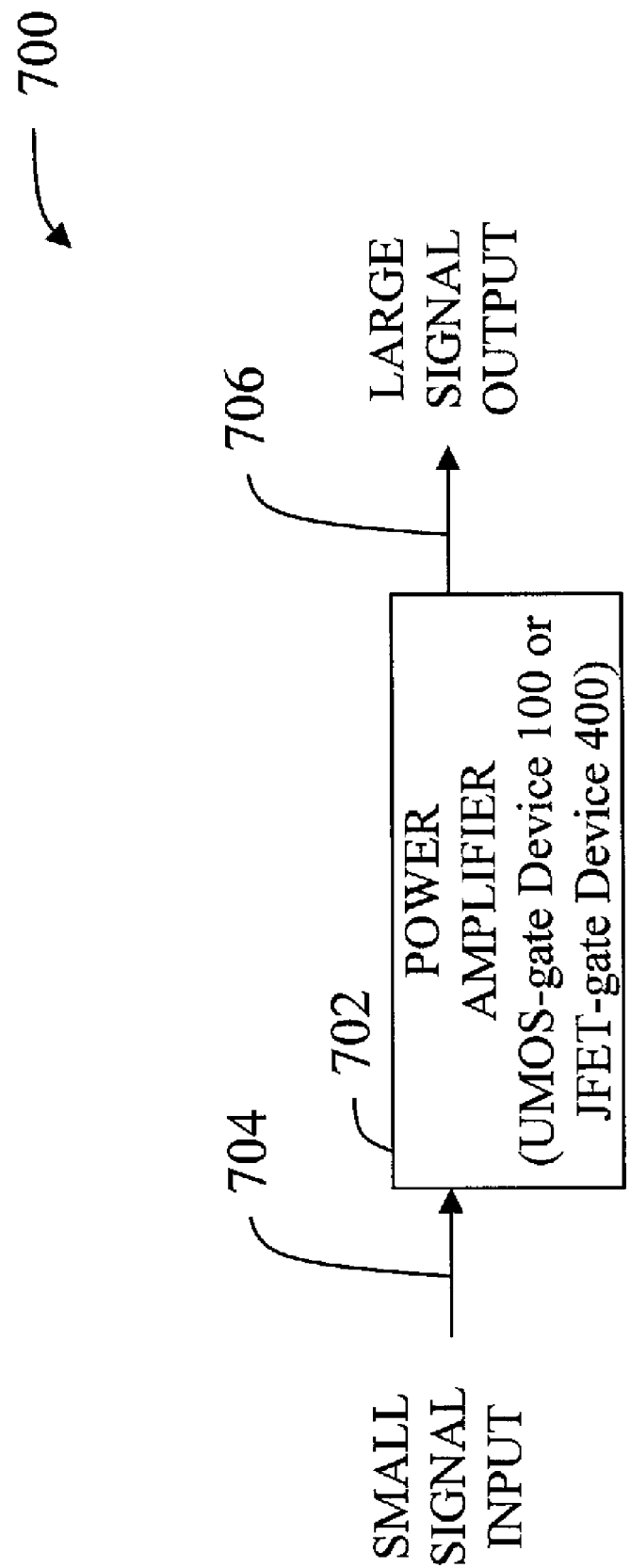
FIG. 7 shows an exemplary amplifier using a semiconductor device having a gate structure according to an embodiment of the present invention.

FIG. 7 shows an exemplary amplifier 702 using a semiconductor device having a gate structure (100, 400), according to an embodiment of the present invention. A small signal input 704 is applied to the amplifier 702 that produces a corresponding large signal output 706. For each gate structure (100, 400) applying a controlling voltage to the gate terminal, a controlling voltage may be applied to the gate terminal (202, 502) which may be effective in controlling the flow of electrical current between the source terminal (176, 486) and the drain terminal (174, 490). Power connections, signal conditioning and support circuitry are not shown for the sake of clarity. Other details regarding the use of a semiconductor device in an amplifier application are omitted since they are considered as known to a person of ordinary skill in the relevant art. Other applications of the disclosed gate structures (100, 400) are possible.

Embodiments described above illustrate but do not limit the invention. It should also be understood that numerous modifications and variations are possible in accordance with the principles of the present invention. Accordingly, the scope of the invention is defined only by the following claims.

We claim:

1. A gate structure for a U-shape Metal-Oxide-Semiconductor (UMOS) device, comprising:
    a dielectric layer formed into a U-shape having side walls and a floor to form a trench surrounding a dielectric layer interior region;
    a doped poly-silicon layer deposited adjacent to the dielectric layer within the dielectric layer interior region, the doped poly-silicon layer having side walls and a floor surrounding a doped poly-silicon layer interior region;
    a first metal layer deposited adjacent to the doped poly-silicon layer and in the doped poly-silicon layer interior region on a side opposite from the dielectric layer, the first metal layer having side walls and a floor surrounding a first metal layer interior region; and
    an undoped poly-silicon layer deposited to fill the first metal layer interior region, wherein:
        the first metal layer is between the undoped poly-silicon layer and the doped poly-silicon layer; and
        the undoped poly-silicon layer is interior to the doped poly-silicon layer.

2. The gate structure of claim 1, wherein the dielectric layer is composed of a dielectric material selected from the group consisting of silicon-dioxide (SiO2) and silicon-nitride (Si3N4), the dielectric layer having a thickness of between about 0.4 microns to about 0.8 microns.

3. The gate structure of claim 1, wherein the doped poly-silicon layer is composed of a positively doped semiconductor material selected from the group consisting of silicon (Si) and silicon carbide (SiC), the doped poly silicon layer having a doping concentration of between about 5×1018 cm-3 to about 5×1020 cm-3, the doped poly silicon layer having a thickness of between about 2.0 microns to about 4.0 microns.

4. The gate structure of claim 1, wherein the first metal layer includes molybdenum having a thickness of between about 0.3 microns to about 0.6 microns, the first metal layer being electrically connected to a gate terminal.

5. The gate structure of claim 4, wherein end portions of the side walls of the first metal layer are disposed below the side walls of the dielectric layer a distance of between about 0.5 microns to about 2.0 microns.

6. The gate structure of claim 1, further comprising:
    a P+ Junction gate adjacent to a floor portion of the dielectric layer, the P+junction gate being composed of a P-type doped semiconductor material selected from the group consisting of silicon (Si) and silicon carbide (SiC), the P+junction gate having a doping concentration of between about 1×1018 cm-3 and 5×1018 cm-3, the P+junction gate being one of blanket doped and locally doped, the P+junction gate having thickness from about 0.2 microns to about 0.5 microns.

7. The gate structure of claim 6, further comprising:
a drift region surrounding the dielectric layer and the P+ Junction gate.

8. The gate structure of claim 7, further comprising a drain terminal adjacent to the drift region on a side opposite the P+ Junction gate, the drain terminal comprising a second metal layer consisting of a metal selected from the group consisting of aluminum (Al) and nickel (Ni).

9. The gate structure of claim 1, further comprising a source terminal adjacent to the dielectric layer on a side facing the dielectric layer interior region, the source terminal comprising a third metal layer consisting of a metal selected from the group consisting of aluminum (Al) and nickel (Ni).

10. The gate structure of claim 8, further comprising a cap layer disposed between the source terminal and the undoped poly-silicon layer, the cap layer consisting of a material selected from the group consisting of silicon dioxide (SiO2) and undoped poly-silicon, the cap layer having a thickness of between about 0.5 microns to about 2.0 microns.

11. The gate structure of claim 9, further comprising:
a first conduction channel disposed adjacent to the dielectric layer and between the source terminal and the drift region,
wherein the first conduction channel comprises:
a first N+ doped region having a first surface, a second surface, a first end, and a second end;
a first P-channel region having a first surface, a second surface, a first end, and a second end;
a first P+ doped region having a first surface, a second surface, a first end, and a second end,
wherein the first N+ doped region first surface is adjacent to the source terminal, the N+ doped region second end is adjacent to the dielectric layer where the dielectric layer meets the source terminal, the N+ doped region second surface is adjacent to the P-channel first surface, the P-channel second surface is adjacent to the drift region, the P-channel second end is adjacent to the dielectric layer, the P+ doped region first surface is adjacent to the source terminal, the N+ doped region first end, and the P-channel first end, and the P+ doped region second surface is adjacent to the drift region.

12. The gate structure of claim 10, further comprising:
a second conduction channel disposed adjacent to the dielectric layer and between the source terminal and the drift region in a position opposite the first conduction channel,
wherein the second conduction channel comprises:
a N+ doped region having a first surface, a second surface, a first end, and a second end;
a P-channel region having a first surface, a second surface, a first end, and a second end;
a P+ doped region having a first surface, a second surface, a first end, and a second end,
wherein the N+ doped region first surface is adjacent to the source terminal, the N+ doped region second end is adjacent to the dielectric layer where the dielectric layer meets the source terminal, the N+ doped region second surface is adjacent to the P-channel first surface, the P-channel second surface is adjacent to the drift region, the P-channel second end is adjacent to the dielectric layer, the P+ doped region first surface is adjacent to the source terminal, the N+ doped region first end, and the P-channel first end, and the P+ doped region second surface is adjacent to the drift region.

13. A gate structure for a Junction Field Effect Transistor (JFET) device, comprising:
a dielectric layer having two disjoint sidewall regions deposited on side walls of a trench having side walls and a floor, each disjoint side wall region having a first side facing into a trench interior region and a second side facing away from the trench interior region;
a metal layer formed into a U-shape deposited on the dielectric layer first sides and the floor of the of the trench surrounding a metal layer interior region, the metal layer being electrically connected to a gate terminal;
an undoped poly-silicon layer deposited to fill the metal layer interior region, the undoped poly-silicon layer being composed of a semiconductor material selected from the group consisting of silicon (Si) and silicon carbide (SiC).

14. The gate structure of claim 13, wherein the dielectric layer is composed of a dielectric material selected from the group consisting of silicon-dioxide (SiO2) and silicon-nitride (Si3N4), the dielectric layer having a thickness of between about 0.4 microns to about 0.8 microns.

15. The gate structure of claim 13, wherein the metal layer includes molybdenum having a thickness of between about 0.3 microns to about 0.6 microns, the metal layer comprising a gate terminal.

16. The gate structure of claim 13, wherein end portions of the side walls of the metal layer are disposed below the side walls of the dielectric layer disjoint sidewall regions a distance of between about 0.2 microns to about 2.0 microns.

17. The gate structure of claim 13, further comprising:
a drift region surrounding the dielectric layer second sides and the P+ Junction gate, the drift region being composed of a semiconductor material selected from the group consisting of silicon (Si) and silicon carbide (SiC); and
a drain terminal adjacent to the drift region on a side opposite the P+ Junction gate, the drain terminal comprising a second metal layer consisting of a metal selected from the group consisting of aluminum (Al) and nickel (Ni).

18. The gate structure of claim 13, further comprising a source terminal adjacent to the dielectric layer on a side facing the metal layer interior region, the source terminal comprising a second metal layer consisting of a metal selected from the group consisting of aluminum (Al) and nickel (Ni).

* * * * *